(12) United States Patent
Li

(10) Patent No.: US 7,701,713 B2
(45) Date of Patent: Apr. 20, 2010

(54) MOUNTING APPARATUS FOR FAN

(75) Inventor: Zhan-Yang Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/187,862

(22) Filed: Aug. 7, 2008

(65) Prior Publication Data

US 2009/0257192 A1 Oct. 15, 2009

(30) Foreign Application Priority Data

Apr. 9, 2008 (CN) .......................... 2008 2 0300526

(51) Int. Cl.
*H05K 7/20* (2006.01)
(52) U.S. Cl. ............... 361/695; 361/679.48; 415/213.1; 415/214.1; 416/244 R; 417/423.15; 165/80.1; 165/80.2
(58) Field of Classification Search ............ 361/679.46, 361/679.48, 679.5, 690–697, 725, 726; 174/15.1, 174/16.1, 16.3, 252; 165/80.3, 104.33, 185, 165/121–126; 439/79, 166, 485, 894; 415/213.1, 415/214.1, 216.1, 178; 416/247 R, 178, 416/146 R, 244 R, 69, 70 R; 417/423.14; 248/27.1
See application file for complete search history.

(56) References Cited

U.S. PATENT DOCUMENTS 5,562,410 A * 10/1996 Sachs et al. ............... 415/213.1
6,213,819 B1 * 4/2001 Fan .............................. 439/894
6,373,698 B1 * 4/2002 Christensen ................ 361/695
6,556,437 B1 * 4/2003 Hardin .................... 361/679.48
6,817,889 B2 * 11/2004 Chang et al. ................. 439/485
7,167,371 B2 * 1/2007 Coles et al. .................. 361/726
7,236,361 B2 * 6/2007 Cote et al. ................... 361/695
7,304,843 B2 * 12/2007 Peng et al. ............. 361/679.48
7,537,480 B2 * 5/2009 Li ............................... 439/485
2007/0035924 A1 * 2/2007 Westphall et al. ........... 361/687
2008/0151495 A1 * 6/2008 Yin et al. ..................... 361/695
2008/0158813 A1 * 7/2008 Yin ............................. 361/695
2009/0059521 A1 * 3/2009 Yin ............................. 361/695

* cited by examiner

Primary Examiner—Michael V Datskovskiy
(74) Attorney, Agent, or Firm—D. Austin Bonderer

(57) ABSTRACT

An electronic device enclosure includes a chassis having a base plate, a number of fans, a number of securing boards mounted on the corresponding fans, and a number of pivot members. The receiving bracket includes a first sidewall, a second sidewall parallel to the first sidewall, and a bottom wall secured to the base plate and connecting the first sidewall to the second sidewall together such that the first sidewall, the second sidewall, and the bottom wall cooperatively define a receiving housing configured for receiving the fans. The pivot members each has a pivot end attached to the corresponding securing boards and a securing end secured to the first sidewall of the receiving bracket. Each pivot member is capable of rotating about a pivot axis of the securing board and configured for securing the corresponding fan to the receiving housing.

16 Claims, 3 Drawing Sheets

MOUNTING APPARATUS FOR FAN

BACKGROUND

1. Field of the Invention

The present invention relates to a mounting apparatus for mounting a fan to an electronic device enclosure.

2. Description of Related Art

Electronic devices generate heat during operation. Electronic components may overheat and become damaged if this heat is not removed. Some electronic devices use a fan to draw heat away from the electronic components. A fan is typically mounted in the electronic device using a set of screws. Many electronic systems, such as servers, produce an enormous of heat because of the large number of electronic components in the system. More than one fan is often needed to cool the components efficiently. Thus, it becomes difficult and time consuming to remove the fans for repair or replacement.

Therefore, a mounting apparatus using fans that can be attached and removed easily from the electronic device enclosure is desired to overcome the above-described shortcomings.

DETAILED DESCRIPTION OF THE EMBODIMENTS

Figure 1:
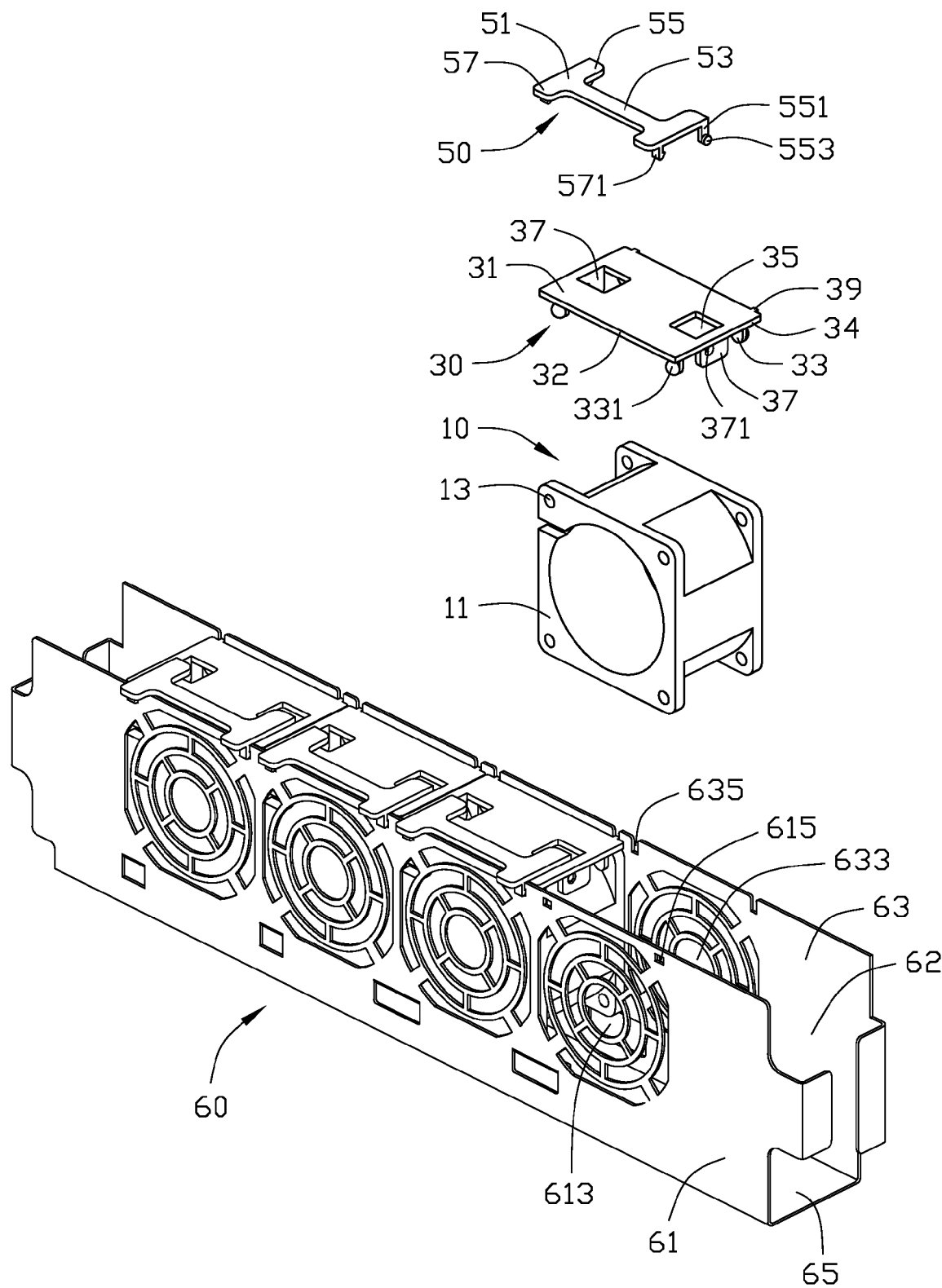
FIG. 1 is an exploded, isometric view of a mounting apparatus for mounting fans.

Referring to FIG. 1, a mounting apparatus (not labeled) for mounting a fan 10 includes a securing plate 30 mounted on a top surface of the fan 10, a pivot member 50 pivotally secured to the securing member 30, and a receiving bracket 60. The fan 10 has a pair of parallel rectangular plates 11. Each plate defines a securing hole 13 at each of the four corners.

The securing board 30 includes a rectangular base 31. Two openings 35 are defined in the base 31. In the illustrated embodiment, a tab 37 extends from an outer edge of each of the two openings 35. A pivot hole 371 is defined in each tab 37. In another embodiment, the pivot holes 371 may be formed in tabs (not shown) extending from the fan 10. A securing member 33 extends from each of the four corners of the base 31. Each securing member 33 includes a protrusion 331 configured for engaging in the corresponding securing hole 13 in the fan 10. Two sliding posts 39 protrude from a first edge 32 of the base 31.

In the illustrated embodiment, the H-shaped pivot member 50, includes two parallel arms 51 and a handle 53 connecting the two arms 51. Each arm 51 has a pivot end 55 and an opposite securing end 57. The handle 53 is integrally formed with the two arms 51 and is adjacent to the securing ends 57. A pivoting arm 551 extends from each pivot end 55. A pivoting post 553 protrudes from a distal end of each pivoting arm 551. The pivoting post 553 is configured to pivotally engage with the pivot holes 371. An elastic securing hook 571 extends from the securing end 57 of each arm 51.

The receiving bracket 60 includes a first sidewall 61, a second sidewall 63 parallel to the first sidewall 61, and a bottom wall 65 connecting the first sidewall 61 and the second sidewall 63. The distance between the first and second sidewalls 61, 63 is substantially equal to the width of the fan 10. A receiving housing 62 is cooperatively defined by the first sidewall 61, the second sidewalls 63, and the bottom wall 65. The receiving housing 62 is configured for receiving a plurality of fans 10. A plurality of ventilation areas 613, 633 are respectively defined in the first sidewall 61 and the second sidewall 63. Two securing slots 615 corresponding to the protrusions 331, are defined in the first sidewall 61. Two guiding slots 635 corresponding to the sliding posts 39 are defined in the second sidewall 63 at opposite sides of the ventilation area 633 and extend from an upper edge of the second sidewall 63.

Figure 2:
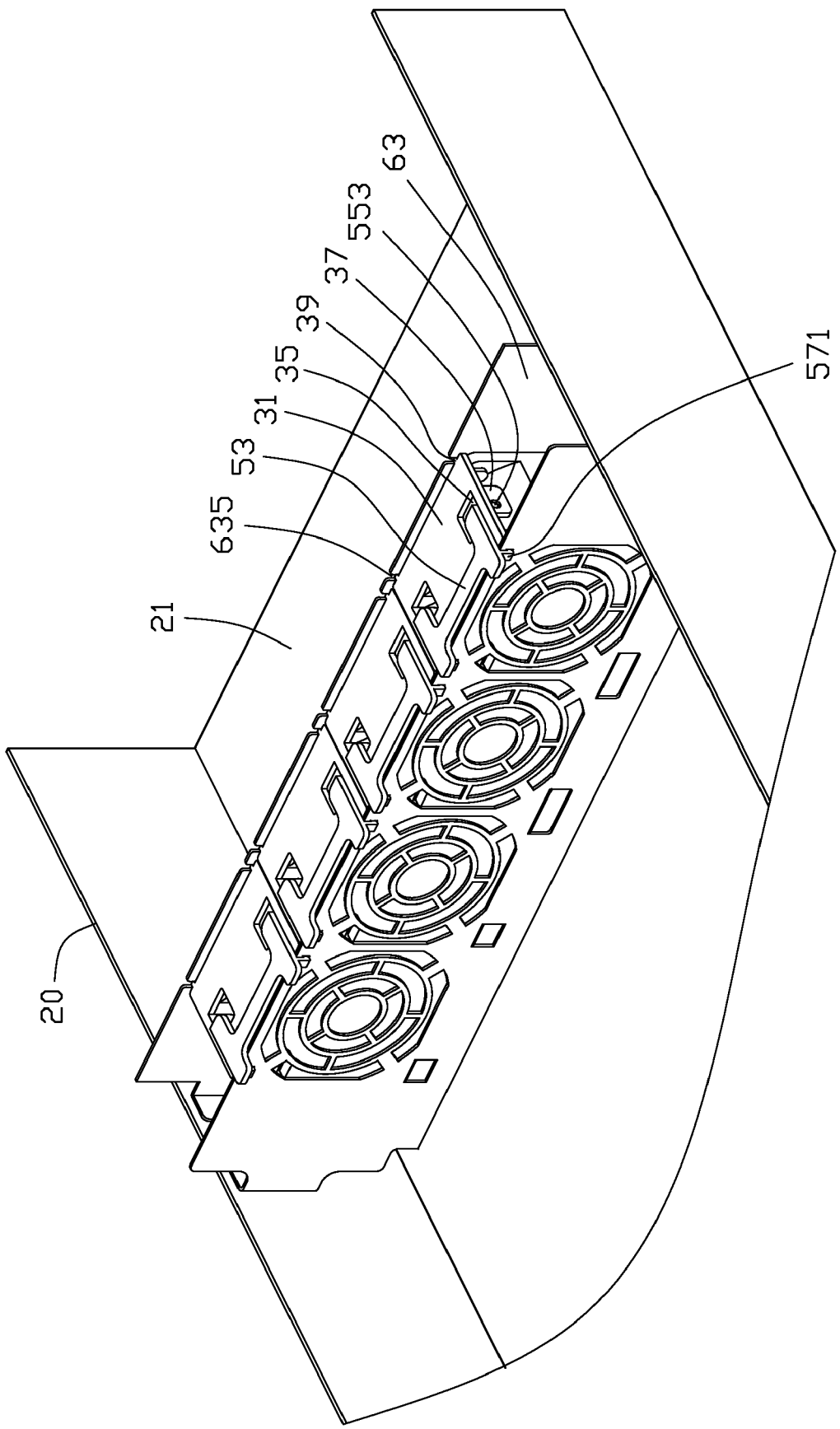
FIG. 2 is an assembled, isometric view of the mounting apparatus of FIG. 1 mounted in a chassis of an electronic device enclosure.

Referring also to FIG. 2, the pivot ends 55 extend through the openings 35 in the securing board 30. The pivoting arms 551 may elastically deform toward each other to allow the pivoting posts 553 to pivotally engage with the pivot holes 371. The protrusions 331 engage in the corresponding securing holes 13 to secure the securing member 30 to the fan 10. The base 31 may abut against top edges of the two plates 11. The pivot member 50 is capable of rotating about a pivot axis defined by the two pivot holes 371. The fan 10 is mounted inside the receiving housing 62 and aligned with the corresponding pair of ventilation areas 613, 633. The sliding posts 39 slide into the guiding slots 635. The securing hooks 571 are elastically deformed by the out side of the first sidewall 61 until the securing hooks 571 are engaged in the securing slots 615. As a result, the fan 10 is secured in the receiving bracket 60. The plurality of fans is similarly mounted in the receiving bracket 60. The fans may tightly abut each other in the receiving bracket 60. The receiving bracket 60 is secured to a base plate 21 of a chassis 20. The bottom wall 65 of the receiving bracket 60 may abut the base plate 21.

Figure 3:
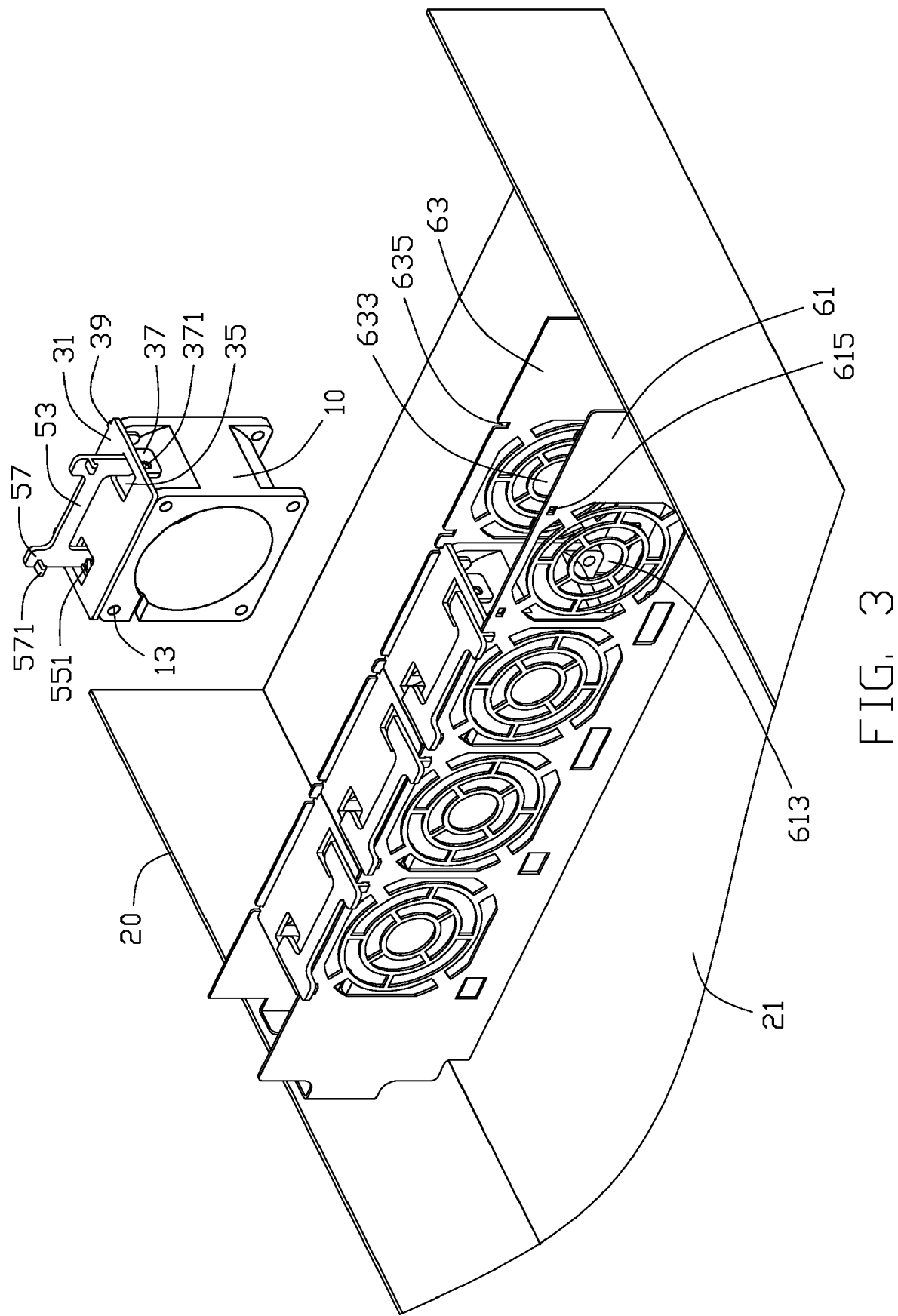
FIG. 3 is an assembled, isometric view of the chassis and mounting apparatus of FIG. 2, with a fan module removed.

Referring to FIG. 3, the fan may be removed by pulling the handle 53 up, such that the pivot member 50 rotates about the pivot axis and the securing hooks are drawn out from the securing slots 615. The fan 10 can then be drawn out from the receiving bracket 60 by sliding the sliding posts 39 out from the guiding slots 635.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device enclosure comprising:
   a chassis having a base plate;
   a plurality of fans;
   a receiving bracket comprising:
     a first sidewall;
     a second sidewall parallel to the first sidewall; and
     a bottom wall secured to the base plate and connecting the first sidewall to the second sidewall together such that the first sidewall, the second sidewall, and the bottom wall cooperatively define a receiving housing configured for receiving the plurality of fans;
   a plurality of securing boards mounted on the corresponding fans; and
   a plurality of pivot members each having a pivot end pivotally attached to the corresponding securing board and a securing end secured to the first sidewall of the receiving bracket, and each securing end engaging with the first sidewall to secure the corresponding fan in the receiving housing, wherein the first sidewall is sandwiched between the securing end and the corresponding fan.

2. The electronic device of claim 1, wherein each pivot member comprises two parallel arms and a handle connecting the arms; the pivot end is defined at one end of each arm; two openings are defined in the securing board.

3. The electronic device of claim 2, wherein two tabs each extending perpendicularly from an outer edge of each of the two openings; each tab defines a pivot hole; a pivoting post protrudes from each pivot end; the pivoting post is configured to pivotally engage with the pivot holes.

4. The electronic device of claim 2, wherein the pivot member further comprises two securing hooks extending from the securing end.

5. The electronic device of claim 2, wherein a sliding post protrudes from an edge of the securing board; the second sidewall defines a guiding slot extending from a top edge; the sliding post is configured to slide in the guiding slot to secure the corresponding fan to the receiving housing.

6. The electronic device of claim 1, wherein a plurality of spaced ventilation areas are defined in the first sidewall and the second sidewall such that each fan is aligned to a corresponding ventilation area in the first sidewall and the second sidewall; two guiding slots are defined in the second sidewall at opposite sides of each ventilation area and extend from an upper edge of the second sidewall; two sliding posts protrude from a side edge of each securing board corresponding to the two guiding slots.

7. The electronic device of claim 1, wherein each fan comprises two parallel plates; each plate defines four securing holes at four corners thereof; the securing board is secured to the two plates; four securing protrusions extend from the securing board configured for engaging with the corresponding securing holes adjacent to a top surface of the fan.

8. A mounting apparatus comprising:
a receiving bracket for receiving a fan, comprising:
a first sidewall;
a second sidewall parallel to the first sidewall; and
at least one securing slot defined in the first sidewall adjacent to a top edge of the first sidewall; and
a pivot member pivotally attached to a top surface of the fan, the pivot member having at least one pivot end and at least one securing end;
wherein the at least one pivot end is capable of rotating relative to the fan, and at least one securing hook, corresponding to the at least one securing slot, protrudes from the at least one securing end; the pivot member is capable of abutting on the top of the fan and being engaged into the securing slot from an outside of the first sidewall for blocking the fan in the receiving bracket.

9. The mounting apparatus of claim 8, further comprising a securing board secured to the top surface of the fan; the pivot member is pivotably mounted on the securing board, and the at least one securing end is capable of freely rotating relative to the securing board.

10. The mounting apparatus of claim 9, wherein the pivot member comprises two parallel arms and a handle connecting the arms; two openings are defined in the securing board.

11. The mounting apparatus of claim 10, wherein a tabs extends perpendicularly from an outer edge of each of the two openings; each tab defines a pivot hole; a pivoting post protrudes from each pivot end; the pivoting post is configured to pivotally engage with the pivot holes.

12. The mounting apparatus of claim 10, wherein the pivot member further comprises a securing hook extending from the securing end.

13. The mounting apparatus of claim 10, wherein a sliding post protrudes from an edge of the securing board; the second sidewall defines a guiding slot extending from a top edge; the sliding post is configured to slide in the guiding slot to secure the corresponding fan to the receiving housing.

14. The mounting apparatus of claim 10, wherein the pivot member is H-shaped; the handle is integrally formed with the two arms; the handle is adjacent to the securing ends of the arms.

15. The mounting apparatus of claim 8, wherein two guiding slots are defined in the second sidewall receiving bracket and extend from an upper edge of the second sidewall; two sliding posts protrude from a side of the securing board corresponding to the guiding slots.

16. The mounting apparatus of claim 8, wherein the fan comprises two parallel plates, each plate defines four securing holes at four corners thereof; the securing board is secured to the two plates, four securing protrusions extend from the securing board configured for engaging with the corresponding securing holes adjacent to a top of the fan.

* * * * *